(12) United States Patent
De Vries et al.

(10) Patent No.: US 8,323,753 B2
(45) Date of Patent: Dec. 4, 2012

(54) METHOD FOR DEPOSITION USING PULSED ATMOSPHERIC PRESSURE GLOW DISCHARGE

(75) Inventors: Hindrik Willem De Vries, Tilburg (NL); Eugen Aldea, Eindhoven (NL); Serguei Alexandrovich Starostine, Eindhoven (NL); Mariadriana Creatore, Petten (NL); Mauritius Cornelius Maria Van De Sanden, Tilburg (NL)

(73) Assignee: Fujifilm Manufacturing Europe B.V., Tilburg (NL)

(*) Notice: Subject to any disclaimer, the term of this patent is extended or adjusted under 35 U.S.C. 154(b) by 451 days.

(21) Appl. No.: 12/302,635

(22) PCT Filed: May 24, 2007

(86) PCT No.: PCT/NL2007/050245
§ 371 (c)(1),
(2), (4) Date: Apr. 30, 2009

(87) PCT Pub. No.: WO2007/139379
PCT Pub. Date: Dec. 6, 2007

(65) Prior Publication Data
US 2009/0238997 A1 Sep. 24, 2009

(30) Foreign Application Priority Data

May 30, 2006 (EP) .................................. 06114720
Aug. 28, 2006 (EP) .................................. 06119616

(51) Int. Cl.
*H05H 1/24* (2006.01)
(52) U.S. Cl. .................... 427/569; 427/578; 427/579
(58) Field of Classification Search .................... 427/569, 427/574, 578, 579
See application file for complete search history.

(56) References Cited

U.S. PATENT DOCUMENTS

| | | | |
|---|---|---|---|
| 4,478,878 A | 10/1984 | Neuwald | |
| 4,631,199 A * | 12/1986 | Hall et al. | 427/583 |
| 4,681,780 A | 7/1987 | Kamman | |
| 5,166,870 A * | 11/1992 | Shimizu et al. | 363/41 |
| 5,187,457 A | 2/1993 | Chawla et al. | |
| 5,288,518 A * | 2/1994 | Homma | 427/255.29 |
| 5,422,584 A * | 6/1995 | Waters | 327/113 |
| 5,576,076 A | 11/1996 | Slootman et al. | |
| 5,660,744 A | 8/1997 | Sekine et al. | |
| 5,710,067 A * | 1/1998 | Foote et al. | 438/636 |
| 5,800,877 A * | 9/1998 | Maeda et al. | 427/535 |
| 6,159,559 A * | 12/2000 | Reber et al. | 427/579 |
| 6,413,645 B1 | 7/2002 | Graff et al. | |
| 6,464,779 B1 | 10/2002 | Powell et al. | |
| 6,556,461 B1 * | 4/2003 | Khersonsky et al. | 363/41 |
| 6,613,394 B2 | 9/2003 | Kuckertz et al. | |
| 6,652,924 B2 | 11/2003 | Sherman | |
| 6,756,318 B2 | 6/2004 | Nguyen et al. | |
| 6,774,569 B2 | 8/2004 | de Vries et al. | |
| 6,861,334 B2 | 3/2005 | Raaijmakers et al. | |
| 6,955,836 B2 | 10/2005 | Kumagai et al. | |
| 7,098,131 B2 | 8/2006 | Kang et al. | |
| 7,298,072 B2 | 11/2007 | Czeremuszkin et al. | |
| 7,533,628 B2 | 5/2009 | Bewig et al. | |
| 7,709,159 B2 | 5/2010 | Umetsu et al. | |
| 2002/0011462 A1 | 1/2002 | Richter et al. | |
| 2002/0150839 A1 | 10/2002 | Peng | |
| 2002/0160623 A1 * | 10/2002 | Kakkad | 438/771 |
| 2003/0049375 A1 | 3/2003 | Nguyen et al. | |
| 2003/0082412 A1 * | 5/2003 | Fukuda et al. | 428/697 |
| 2003/0118748 A1 * | 6/2003 | Kumagai et al. | 427/578 |
| 2004/0007985 A1 * | 1/2004 | de Vries et al. | 315/111.91 |
| 2004/0146660 A1 | 7/2004 | Goodwin et al. | |
| 2005/0079418 A1 | 4/2005 | Kelley et al. | |
| 2005/0084610 A1 | 4/2005 | Selitser | |
| 2005/0085077 A1 | 4/2005 | Ogawa et al. | |
| 2005/0093458 A1 | 5/2005 | Babayan et al. | |
| 2006/0147648 A1 * | 7/2006 | De Vries et al. | 427/569 |
| 2006/0231908 A1 | 10/2006 | Liu et al. | |
| 2007/0105389 A1 | 5/2007 | Narishige | |
| 2007/0273411 A1 * | 11/2007 | Harris et al. | 327/103 |
| 2008/0317974 A1 | 12/2008 | De Vries et al. | |
| 2009/0304949 A1 * | 12/2009 | De Vries et al. | 427/569 |

(Continued)

FOREIGN PATENT DOCUMENTS

DE 44 38 533 A1 5/1996

(Continued)

OTHER PUBLICATIONS

Gherardi, Nicolas, et al., "A new approach to SiO2 deposit using a N2-SiH4-N2O glow dielectric barrier-controlled discharge at atmospheric pressure". J. Phys. D: Appl. Phys. 33 (2000) L104-L108.*
Martin, S., et al., "Atmospheric pressure PE-CVD of silicon based coatings using a glow dielectric barrier discharge". Surface and Coatings Technology 177-178 (2004) 693-698.*
Babayan, S.E., et al., "Deposition of silicon dioxide films with an atmospheric-pressure plasma jet". Plasma Sources Sci. Technol. 7 (1998) 286-288.*
Watanabe, et al., "Formation Kinetics and Control of Dust Particles in Capacitively-Coupled Reactive Plasmas," *Physica Scripta*, vol. T89, 2001, pp. 29-32.

(Continued)

*Primary Examiner* — Bret Chen
(74) *Attorney, Agent, or Firm* — Gilberto M. Villacorta; Sunit Talapatra; Foley & Lardner LLP

(57) ABSTRACT

Disclosed are methods for deposition of a chemical compound or element using an atmospheric pressure glow discharge plasma in a treatment space comprising two electrodes connected to a power supply for providing electrical power during an on-time ($t_{on}$). The treatment space is filled with a gas composition of an active and an inert gas mixture, including a precursor of the chemical compound or element to be deposited. Dust formation is prevented by using Nitrogen in the gas composition, applying short pulses and using a predetermined residence time of the gas composition in the treatment space. Best results are obtained when using a stabilized plasma.

13 Claims, 6 Drawing Sheets

U.S. PATENT DOCUMENTS

| | | | |
|---|---|---|---|
| 2009/0324971 A1 | 12/2009 | De Vries et al. | |
| 2010/0147794 A1 | 6/2010 | De Vries et al. | |
| 2011/0014424 A1* | 1/2011 | De Vries | 428/141 |
| 2011/0042347 A1 | 2/2011 | Korngold et al. | |
| 2011/0089142 A1* | 4/2011 | Korngold et al. | 216/71 |

FOREIGN PATENT DOCUMENTS

| | | |
|---|---|---|
| DE | 10 2004 043 384 A1 | 3/2006 |
| EP | 0 889 506 A2 | 1/1999 |
| EP | 1 340 838 A1 | 9/2003 |
| EP | 1 351 321 A2 | 10/2003 |
| EP | 1 371 752 A2 | 12/2003 |
| EP | 1 381 257 A2 | 1/2004 |
| EP | 1 383 359 A2 | 1/2004 |
| EP | 1 403 902 A1 | 3/2004 |
| EP | 1 029 702 B1 | 4/2004 |
| EP | 1 548 795 A1 | 6/2005 |
| EP | 1 626 613 A1 | 2/2006 |
| EP | 1 750 294 A1 | 2/2007 |
| EP | 1 371 752 B1 | 5/2008 |
| JP | 58-111380 A | 7/1983 |
| JP | 58-217344 A | 12/1983 |
| JP | 64-033932 A | 2/1989 |
| JP | 04-094169 A | 3/1992 |
| JP | 2000-026632 | 1/2000 |
| JP | 2000-313962 * | 11/2000 |
| JP | 2003-206361 A | 7/2003 |
| JP | 20 04-094169 A | 3/2004 |
| JP | 2006-004740 A | 1/2006 |
| JP | 2007-074110 | 3/2007 |
| WO | WO-99/04411 A1 | 1/1999 |
| WO | WO-01/15220 A1 | 3/2001 |
| WO | WO-01/69644 A1 | 9/2001 |
| WO | WO-03/005461 A1 | 1/2003 |
| WO | WO-2004/019381 A2 | 3/2004 |
| WO | WO-2004/030019 A1 | 4/2004 |
| WO | WO 2004/030019 A1 | 4/2004 |
| WO | WO-2005/033189 A1 | 4/2005 |
| WO | WO 2005/049228 A2 | 6/2005 |
| WO | WO-2005-062337 A1 | 7/2005 |
| WO | WO-2005/062338 A1 | 7/2005 |
| WO | WO-2007/013703 A1 | 2/2007 |
| WO | WO-2007/024134 A1 | 3/2007 |
| WO | WO-2007/078556 A1 | 7/2007 |
| WO | WO-2007/089146 A1 | 8/2007 |
| WO | WO-2007/091891 A1 | 8/2007 |
| WO | WO-2007/145513 A1 | 12/2007 |
| WO | WO-2008/100139 A1 | 8/2008 |
| WO | WO-2009/096785 A1 | 8/2009 |
| WO | WO-2009/099325 A1 | 8/2009 |
| WO | WO 2010/092384 * | 8/2010 |

OTHER PUBLICATIONS

Affinito et al., "A new method for fabricating transparent barrier layers," Thin Solid Films, vols. 290-291, 1996, pp. 63-67.

Bletzinger et al., "The effect of displacement current on fast-pulsed dielectric barrier discharges," J Phys D Appl Phys, vol. 36, No. 13, 2003, pp. 550-1552.

Buss et al., "Synthesis of Silicon Nitride Particles in Pulse Radio Frequency Plasmas," J Vac Sci Technol.A, vol. 14, No. 2, 1996, pp. 577-581 [XP-002391555].

International Search Report for PCT/NL2007/050245, dated Sep. 24, 2007, 3 pages.

Lee, et al.—"Investigation of Silicon Oxide Thin Films Prepared by Atomic Layer Deposition using $SiH_2Cl_2$ and $O_3$ as the precursors"—Japanese Journal of Applied Physics, vol. 43, No. 3A, 2004, pp. L328-L330.

Kanazawa et al., "Glow Plasma Treatment at Atmospheric Pressure for Surface Modification and Film Deposition," Nuclear Instruments and Methods in Physics Research, Feb. 1989, vols. 37-38, Beam Interactions with Materials and Atoms, pp. 842-845.

* cited by examiner

METHOD FOR DEPOSITION USING PULSED ATMOSPHERIC PRESSURE GLOW DISCHARGE

FIELD OF THE INVENTION

The present invention relates to a method for deposition of a chemical compound or element on a substrate using an atmospheric pressure glow discharge plasma in a treatment space, in which an atmospheric pressure glow discharge plasma is generated by applying electrical power from a power supply to at least two electrodes in the treatment space during an on-time, the treatment space being filled with a gas composition, including a precursor of the chemical compound or element to be deposited. In a further aspect, the present invention relates to a plasma deposition apparatus for the deposition of a chemical element or a chemical compound, using a pulsed atmospheric pressure glow discharge plasma in a treatment space filled with a gas composition, comprising at least two electrodes connected to a power supply for providing electrical power to the at least two electrodes, and a gas supply device for providing a gas composition to the treatment space, the gas composition comprising at least Oxygen, Nitrogen and a precursor of the chemical element or compound to be deposited. In a further aspect of this invention, the apparatus is used for the deposition of a chemical compound or element.

PRIOR ART

In the art of using an atmospheric glow discharge plasma for deposition purposes, there are various draw-backs. One of these draw-backs is the stability of the atmospheric plasma's. To improve this stability, various solutions have been provided for example those described in U.S. Pat. No. 6,774,569, EP-A-1383359, EP-A-1547123 and EP-A-1626613. Another draw-back is dust formation upon using an atmospheric glow discharge plasma for deposition purposes. For example, U.S. Pat. No. 5,576,076 teaches the deposition of silicon oxide on a substrate using an atmospheric glow discharge plasma in the presence of a silane in which the deposition of silicon oxide tends to be in the form of a powder.

International patent application WO2005049228 describes a process for depositing a coating on a substrate, using tetraalkylorthosilicate and an atmospheric glow discharge plasma, where allegedly dust formation is prevented. In this invention a perforated electrode is used.

Another method to prevent dust formation is to use glow discharge plasma's at low pressure as described for example in Japanese patent application abstract 07-074110.

In the article 'Formation Kinetics and Control of Dust Particles in Capacitively-Coupled Reactive Plasmas' by Y. Watanabe et al., Physica Scripta, Vol. T89, 29-32, 2001, a description is given of a study at reduced pressure of the influence of both the pulse on-time ($t_{on}$) and pulse off-time ($t_{off}$) in capacitively coupled RF discharges (13.56 MHz). It was shown that an increase in $t_{on}$ duration increases the size and volume fraction of clusters, though the most significant increase occurs above pulse on-time of 10 ms and longer.

It is a known fact, that atmospheric pressure glow discharge plasma's used for deposition of a chemical compound or chemical element suffer from dust formation by which formation of a smooth surface cannot be obtained and the used equipment will accumulate the dust in a short period of time.

SUMMARY OF THE INVENTION

The present invention seeks to provide a method allowing the control of generation of specific species in the gas composition used in a pulsed atmospheric pressure glow discharge plasma, to enable controlled reactant processes in the plasma, by which deposition of layers on a substrate can be achieved without the formation of dust. According to the present invention, a method according to the preamble defined above is provided, wherein the gas composition comprises an amount of Nitrogen between 1 and 99.99% and an amount of Oxygen between 0.01 and 25%. In a further embodiment, the gas composition comprises an amount of Oxygen between 0.01 and 10%. In an even further embodiment, the amount of Oxygen between 0.01 and 1%.

As stated before a problem in using plasma for deposition of layers of materials like chemical compounds and chemical elements is the formation of dust or powder, which results in a poor quality of the deposited layer (irregular, non-uniform, etc.), while the apparatus is getting dirty. In the treatment space, in addition to the precursor of compounds to be deposited a gas composition at atmospheric pressure should be present. In case of oxidative processes Oxygen should be present and besides Oxygen an inert gas. The inert gas may be a noble gas, such as Helium, Neon or Argon. In case of the use of a noble gas the efficiency of deposition will decrease significantly using Oxygen concentrations of less than about 1.3% of the total gas composition. We have now found surprisingly, that upon the addition of Nitrogen the efficiency of Oxygen is increased significantly in the whole range of possible Oxygen concentrations. We even get a very good deposition efficiency at Oxygen concentrations as low as 0.01% of the total gas composition. Applying the method according to the present invention will result in a big improvement of layer quality, much less powder formation and a better surface smoothness.

The precursor is e.g. used in a concentration from 2 to 500 ppm. E.g. in a further embodiment, the gas composition comprises from 75% to 99.99% of a noble gas Nitrogen mixture and an Oxygen amount from 0.01 to 25%, wherein the amount of Nitrogen and noble gas in the mixture can be from 1 to 99% and the total gas composition sums up to 100% including the precursor amount.

The noble gas can be selected e.g. from Helium, Neon or Argon, taking into account however, that always Nitrogen gas is present. As the enhancement of the Oxygen can already be obtained at very low Nitrogen concentrations, the ratio of noble gas to Nitrogen can vary from 1 to 99 until 99 to 1.

Good results have been obtained when using Argon as noble gas.

In a further embodiment the gas composition further comprises an active gas such as hydrogen gas, carbon dioxide, ammonia, oxides of nitrogen, or any other suitable active gas, wherein the active gas partly or completely replaces the amount of Oxygen in the gas composition.

The electrical power may be applied using a generator, which provides a sequence of e.g. sine wave train signals as the periodic electrical power supply for the electrodes. The frequency range may be between 10 kHz and 30 MHz, e.g. between 100 kHz and 450 kHz.

In a further embodiment dust formation is prevented by controlling the absolute value of the charge density (product of current density and time) generated during the power on pulse. In one embodiment this value is smaller than 5 micro Coulomb/cm$^2$, e.g. 2 or 1 microCoulomb/cm$^2$.

The power pulses applied to the electrodes as such may have an on-time which may be even as little as 0.5 ms or even 0.05 ms, but may also be as large as 500 ms. Using such short pulses in combination with the use of Nitrogen results in a very efficient deposition process.

Further measures to enhance the layer deposition quality and to reduce the dust formation may include to apply no electrical power to the at least two electrodes during an off-time. This off-time will allow dust coagulation centers, when formed at all during the on-time, to decay. In an embodiment, the on-time is shorter than a predetermined time period, the predetermined time period corresponding substantially to the time necessary for forming charged particles from the precursor in the treatment space. In further embodiments, the predetermined time period is less than 0.5 ms, for example less than 0.3 ms.

In a further embodiment, the duty cycle of the pulsed plasma which is the percentage of the power on-time divided by the power on-time together with the power-off time is at least 1%. In other words, the ratio between the on-time and the sum of the on-time and the off-time is from 1% upwards. In a specific embodiment, the duty cycle is at least 10%. Through the use of Nitrogen the duty cycles can be increased significantly compared to the state of the art, while still no dust is formed. In a further embodiment, the sum of on-time ($t_{on}$) and off-time ($t_{off}$) substantially corresponds to a time of residence of the gas composition in the treatment space but can also be shorter than the residence time of the gas for example as low as one tenth of the average residence time of the gas composition. This allows e.g. to accurately determine the necessary gas composition for providing a layer of a specified thickness.

In an even further embodiment, the substrate is selected from the group of plastics, glasses, ceramics and the like.

In order to obtain a deposition layer of uniform thickness and a smooth surface it is important to have a stable plasma e.g. preventing instabilities like streamers filamentary discharges and the like. In a further embodiment the atmospheric glow discharge plasma is stabilized by stabilization means counteracting local instabilities in the plasma. By the power pulse of the power generator a current pulse is generated which causes a plasma current and a displacement current. The stabilization means are arranged to apply a displacement current change for controlling local current density variations associated with a plasma variety having a low ratio of dynamic to static resistance, such as filamentary discharges. By damping such fast variations using a pulse forming circuit an uniform glow discharge plasma is obtained. In a further embodiment, the displacement current change is provided by applying a change in the applied voltage to the two electrodes, the change in applied voltage being about equal to an operating frequency of the AC plasma energizing voltage, and the displacement current change having a value at least five times higher than the change in applied voltage.

In a further aspect, the present invention relates to a plasma deposition apparatus according to the preamble as defined above wherein the gas supply device is arranged such that the gas composition comprises an amount of Nitrogen between 1 and 99.99% and an amount of Oxygen between 0.01 and 25%.

The gas supply device, or more general, means for providing the gas composition can provide the individual gases with an accuracy of at least 1% of the flow used. This accuracy should be maintained over the ranges of flows used in order to provide gas compositions in the treatment space which can have an Oxygen concentration ranging from 0.01 to 25% and comprises an amount of Nitrogen ranging from 1 to 99.99%. Furthermore the means provide a glass flow which determines the residence time of the gas in the treatment space. This residence time may correspond to mentioned cycle time, but using the embodiments of the present invention it may be as high as for example 10 times the cycle time, which is the sum of the $t_{off}$ and $t_{on}$ time also named the APG cycle time.

In a further embodiment, the gas supply device may be arranged to perform the methods according to various embodiments described above. Similarly, the power supply of the plasma deposition apparatus may be arranged to perform further method embodiments as described above. Furthermore, the power supply may comprise stabilization means arranged to perform the method according to further embodiments described above.

As mentioned above in relation to the method embodiments, the present plasma deposition apparatus may be used advantageously for depositing layers of material on a substrate. For this, the plasma deposition apparatus may be arranged to receive a gas composition comprising the precursor of a chemical compound or chemical element to be deposited in a concentration from 2 to 500 ppm. The gas composition may further comprise, besides Nitrogen, a noble gas, such as Helium, Neon or Argon, where the ratio of the noble gas to Nitrogen should have a value ranging from 1 to 99 until 99 to 1.

In an even further aspect, the present invention relates to the use of a plasma deposition apparatus according to any one embodiment of the present invention for depositing a layer of material on a substrate in the treatment space.

It has been found that the present method may also be applied to improve certain characteristics when applying layers of material to films or foils. E.g. it is possible to improve the Oxygen Transmission Rate (OTR) (together with the water vapor transmission rate (WVTR) to some extend) of a polyethylene naphthalate (PEN) barrier film by depositing a thin $SiO_2$ layer using the present invention. Furthermore, it is also possible to improve the WVTR of a triacetyl cellulose (TAC) film by depositing a thin $SiO_2$ film using the present invention. By the addition of Nitrogen in the APG discharge plasma gas, higher duty cycles may be accomplished, which result in an improvement of the OTR in PEN film and WVTR in TAC film, respectively.

In one embodiment the apparatus according to the present invention can provide for deposition rates of more than 1 nm/s, e.g. 5 nm/s or even 10 nm/s.

In another embodiment the apparatus of this invention is used to apply multiple layers of material by having multiple passes of the substrate through the treatment space, or by having treatment spaces placed in line with each other. In this last embodiment layers of different composition can be applied over each other in a very efficient way, having a thickness of each layer of 1 nm or more.

The substrates used in the deposition process are not limited to a particular substrate and can range from wafers, ceramics, plastics and the like. The thickness of the substrates might be between 20 and 800 µm, e.g. 50 µm or 200 µm

SHORT DESCRIPTION OF DRAWINGS

The present invention will be discussed in more detail below, using a number of exemplary embodiments, with reference to the attached drawings, in which FIG. 1 shows a schematic view of a plasma generation apparatus in which the present invention may be embodied;

DETAILED DESCRIPTION OF EXEMPLARY EMBODIMENTS

Figure 1:
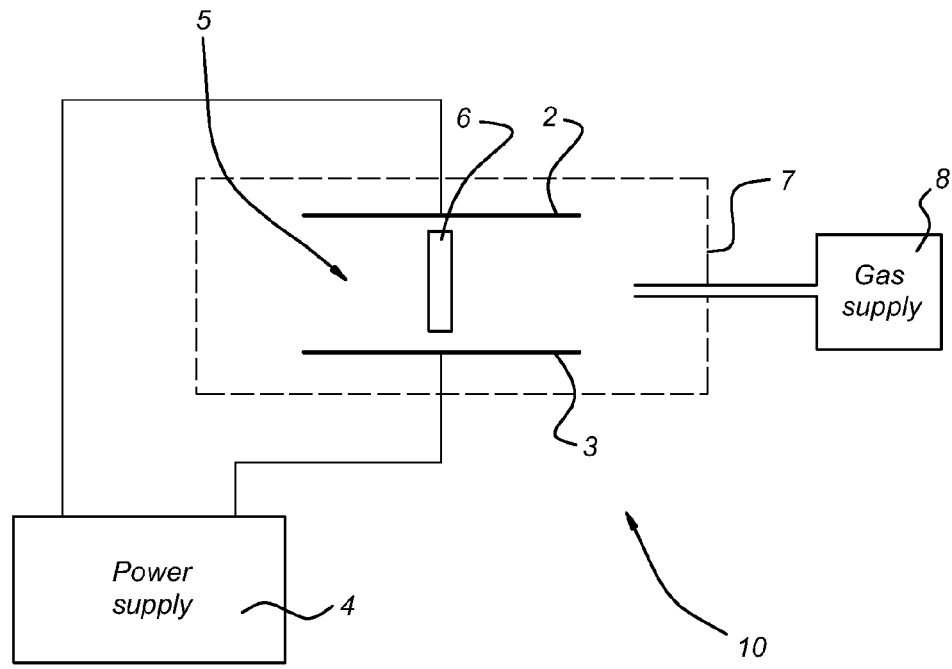

FIG. 1 shows a schematic view of a plasma apparatus 10 in which the present invention may be applied. A treatment space 5, which may be a treatment space within an enclosure 7, or a treatment space 5 with an open structure, comprises two electrodes 2, 3. In general the electrodes 2, 3 are provided with a dielectric barrier in order to be able to generate and sustain a glow discharge plasma at atmospheric pressure in the treatment space. Alternatively, a plurality of electrodes 2, 3 is provided. The electrodes 2, 3 are connected to a power supply 4, which is arranged to provide electrical power to the electrodes for generating the glow discharge plasma under an atmospheric pressure in the treatment space 5. In the treatment space 5, a combination of gasses is introduced from a gas supply device 8, including a pre-cursor. The gas supply device 8 may be provided with storage, supply and mixing components as known to the skilled person. The purpose is to have the precursor decomposed in the treatment space 5 to a chemical compound or chemical element which is deposited on a substrate. In general the combination of gases comprises besides the precursor an active gas like for example Oxygen and a mixture of inert gases. When using such embodiments in general dust formation is observed after very short deposition times and a smooth dust-free deposition cannot be obtained. In plasmas used for high quality applications (microelectronics, permeation barrier, optical applications) dust formation is a serious concern. For such applications the dust formation can compromise the quality of the coating. At atmospheric pressure dust formation is a common fact, due to the typical large power density of the plasma and large concentrations of reactive molecules. For this reason the industrial use of atmospheric plasmas for coating applications is presently limited to low-end applications such as increasing adhesion. With respect to the mechanism of dust formation in plasma's at atmospheric pressure, it is assumed that the clustering seeds for dust formation are negative and positive ions formed by the dissociation of reactive molecules. In order to prevent dust formation it is necessary to limit the dissociation of molecules by plasma in order to avoid excessive degradation of the molecules or the formation of macro polymers in the plasma. The use of low pressure plasma's is one method to achieve this. At low pressure the ions can not survive more than few milliseconds after the plasma is extinguished and at low pressure the dust particles grow relatively slow (about 10 s) to become of significant size.

Pulsing the power is another standard way to diminish the plasma reactivity by decreasing the average energy transferred to the plasma per unit of time.

In general, in pulsed plasmas the standard method for suppression of dust formation is based on the fast decay of dust coagulation centres during the power off-time of the plasma. This can be regarded as a "natural death" of dust during the plasma off-time. At low pressure plasmas only a short period of power off-time is needed so that the power on-time can be relatively long (in the order of hundreds of ms). The duty cycle, defined as the power on time divided by the sum of the power on and power of time of these pulsing examples is large, typically in the range of 50-98%. Pulsing the plasma with an off-time of a few milliseconds is enough to interrupt the growth of dust particles and to limit thus the dust formation.

Without being bound to theory the present invention is not based on the "natural dead" (decay) of dust coagulation centers but on minimizing their density in plasma so from the stage of Power on time. To the contrary of standard method which is a manipulation of dust formation based on the decay of coagulation centers via adjustment of Power off time this is rather a method based on preventing from the beginning the formation of the coagulation centers.

In low pressure applications for example, no reports of dust formation in for example Ar/$O_2$/HMDSO (hexamethyldisiloxane) plasmas are known, although at high pressure this plasma variety generates extremely dusty coatings after only a few seconds of exposure to the plasma.

At atmospheric pressure high duty cycles could not be obtained until now. At atmospheric pressure duty cycles of less than 5% for example 1% were the maximum duty cycles achievable. Pulsing at atmospheric pressure is required to suppress dust formation but has the disadvantage of a slower treatment of a surface. So a low duty cycle is an option only for a limited range of gas mixtures provided that the density of reactive radicals reduces to almost 0 during plasma off-time. In the present invention we have now surprisingly found, that the duty cycle at atmospheric pressure can be increased significantly to values over 5% and even more than 10% for example 15% or 20%. As stated before in the treatment space 5 a combination of gases is introduced comprising a precursor an active gas for example Oxygen and a combination of inert gases. For most of the inert gas compositions a critical Oxygen concentration can be identified below which the precursor will not decompose completely anymore, giving a deposition comprising the chemical compound or element to be deposited and the precursor or not completely decomposed precursor molecules. For the system hexamethyldisiloxane (HMDSO) as precursor, Oxygen as the active gas and Argon as the inert gas for example we found, that below the critical Oxygen limit of 1.3% no complete decomposition of the HMDSO could be obtained.

To our surprise we found that addition of Nitrogen to the gas mixture increases the efficiency of Oxygen significantly which gives a lot of additional advantages.

Figure 3:
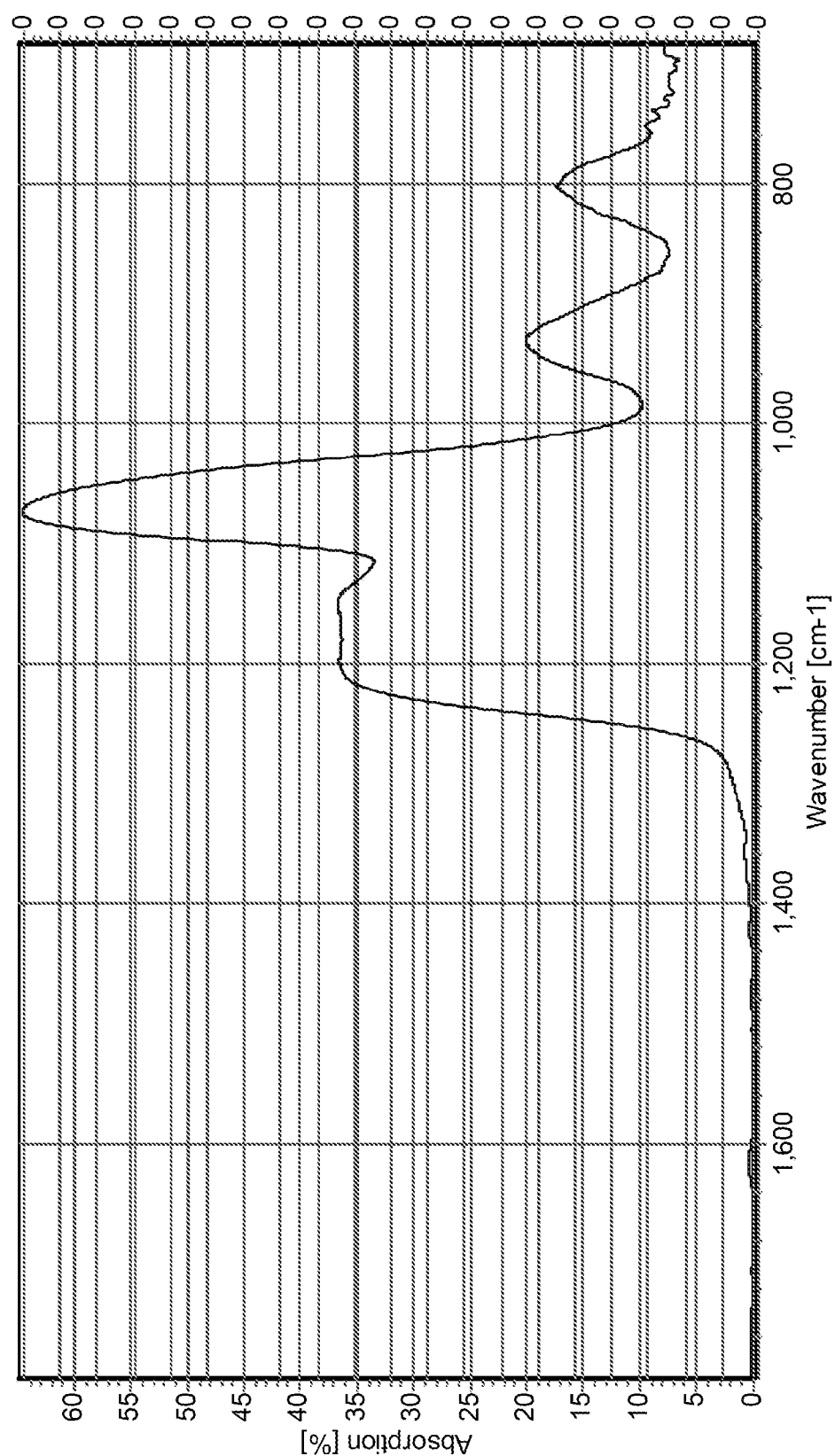
FIG. 3 shows a FTIR-ATR plot of an inventive deposition using HMDSO
Figure 4:
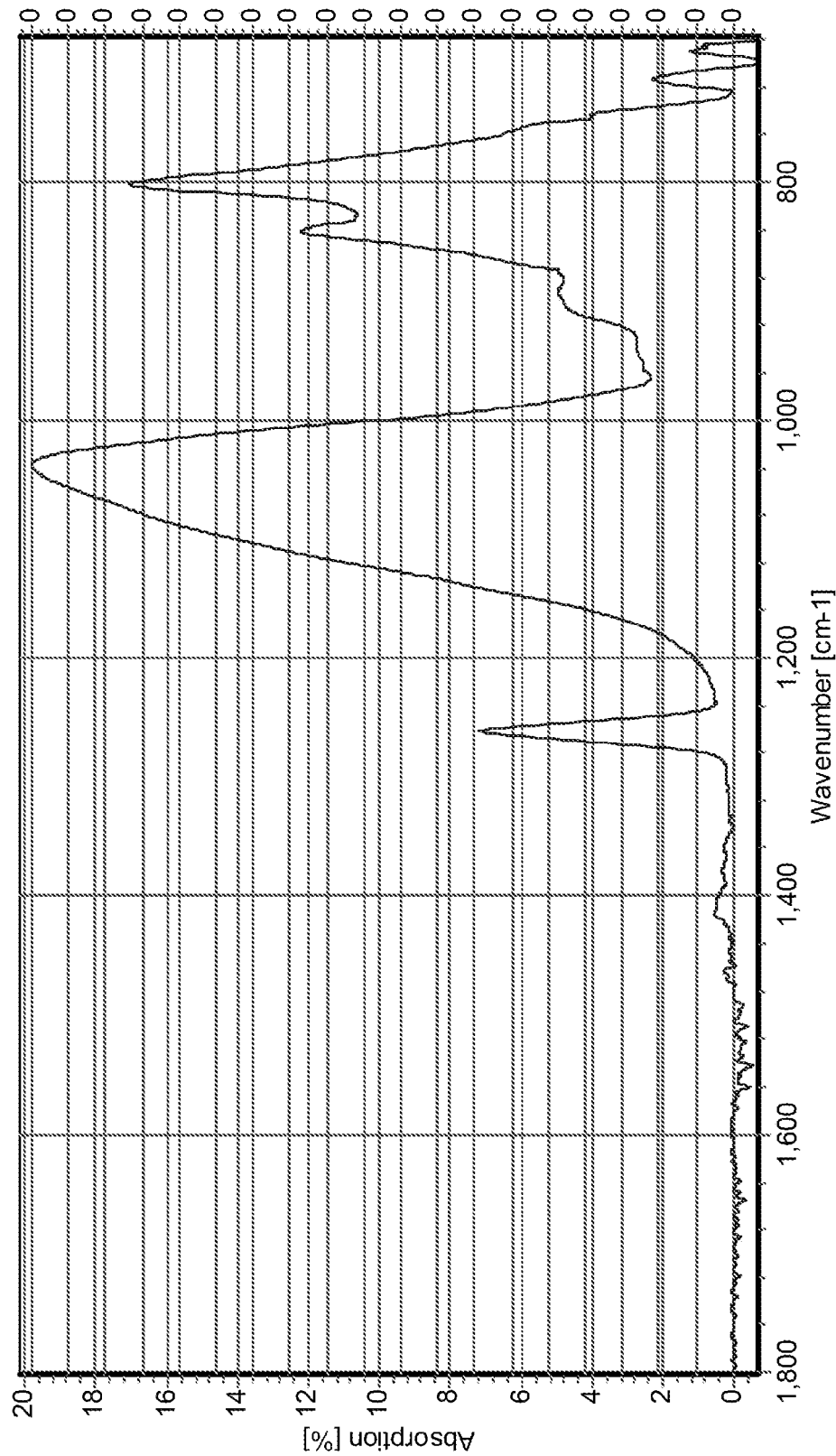
FIG. 4 shows a FTIR-ATR plot of a reference deposition using HMDSO.

In FIG. 4 for example the FTIR_ATR spectrum is shown from a deposition surface with HMDSO as precursor obtained by a plasma with Oxygen as the active gas and Argon as the inert gas, with an Oxygen concentration below the critical value of 1.3%. Around 1280 $cm^{-1}$ clearly the CH3 peak is visible indicating an incomplete dissociation of the precursor which might result in significant dust formation. In FIG. 3 the FTIR-ATR spectrum is shown from a deposition surface with HMDSO as precursor obtained by a plasma with Oxygen as the active gas in a concentration of 0.1% and a mixture of 20% Nitrogen and 79.9% Argon as the inert gas mixture, other condition remaining the same. No peak around 1280 $cm^{-1}$ is observed, indicating a complete dissociation of the precursor.

By using Nitrogen in the inert gas mixture, the activity of the Oxygen is increased significantly and the dust formation is suppressed. The efficiency of deposition is increased when using Nitrogen compared to the deposition without the use of Nitrogen meaning that at the same active gas concentration the deposition is much more efficient and at higher active gas concentrations the formation of dust is suppressed. The use of very low amounts of Oxygen gives, from a chemical point of view, homogeneous deposition and duty cycles can be obtained higher than 5% even higher than 10% for example 20%, 50%, or even 60% without or with only a very limited amount of dust formation.

In one embodiment besides the precursor the gas composition comprises Oxygen and Nitrogen. Oxygen can be used for example from 0.01 to 25% of the gas composition and the gas composition can further comprise Nitrogen in an amount from 99.99% to 1%. In another embodiment Oxygen is used from 0.01-10% and the gas composition can further comprise Nitrogen in an amount from 99.99% to 1%. In still another embodiment Oxygen is used from 0.01 to 1% and the gas composition can further comprise Nitrogen in an amount from 99.99% to 1%. In the method of this invention the required amount of oxygen might be even below 0.01% while still a complete oxidised deposition is obtained. In addition to Nitrogen the gas composition may comprise a noble gas like Helium, Neon or Argon. The amount of the noble gas used can range from 1% to as high as 90 of the total gas composition. Even a value of more than 95% for example 99% can be used. In this embodiment the total gas composition including the precursor amount would be Oxygen in an amount ranging from 0.01 to 25% and noble gas Nitrogen mixture ranging from 99.99% until 75% with the amounts of Nitrogen and noble gas as identified above. When using Argon as noble gas, very good results have been obtained.

Embodiments using only Nitrogen as the inert gas besides the active gas can also advantageously be used.

Because of the fact, that pulsing reduces the formation of dust the power supply 4 may be arranged to provide a periodic electrical signal with an on-time $t_{on}$ and an off-time $t_{off}$, the sum of the on-time and off-time being the period or cycle of the periodic electrical signal.

Figure 2:
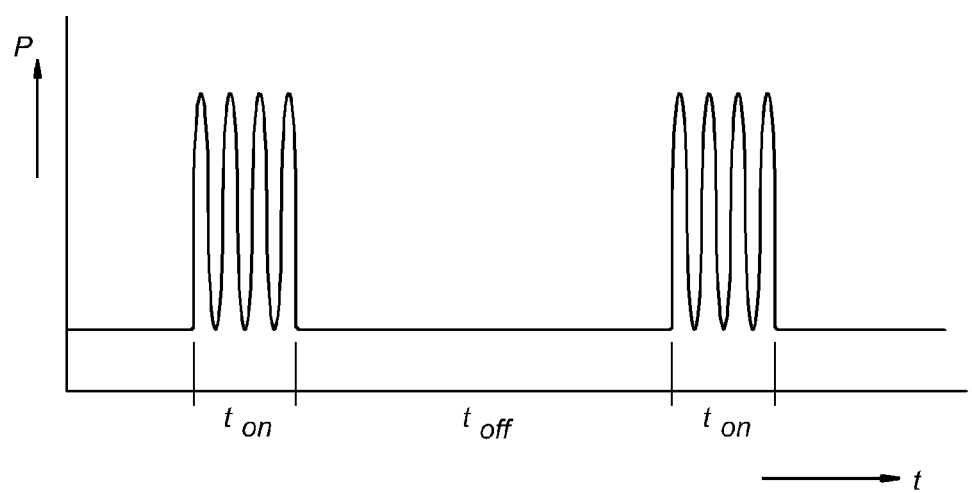
FIG. 2 shows a plot of a periodic signal generated by the power supply to feed the electrodes of the plasma generation apparatus of FIG. 1.

The power supply 4 can be a power supply providing a wide range of frequencies, For example it can provide a low frequency (f=10-450 kHz) electrical signal during the on-time. It can also provide a high frequency electrical signal for example f=450 kHz-30 MHz. Also other frequencies can be provided like from 450 kHz-1 MHz or from 1 to 20 MHz and the like. The on-time may vary from very short, e.g. 20 µs, to short, e.g. 5001 is. Because of the beneficial effect of Nitrogen also an on time of more than 500 µs can be used, for example 1 ms. The on-time effectively results in a pulse train having a series of sine wave periods at the operating frequency, with a total duration of the on-time (e.g. 10 to 30 periods of a sine wave) of 0.1 to 0.3 ms. This is schematically shown in the graph of FIG. 2.

In another embodiment very short pulses are used in order to prevent the dust formation. Using these very short pulses, the dust formation is even further suppressed, while the deposition rate is kept at a high level because through the use of the gas compositions specified above a duty cycle of more than 1% can be realised.

By using very short on-times of the APG plasma, further charging of the particles is effectively prevented, allowing to control the chemical reactions in the treatment space 5 even more efficiently.

In case of the use of very short pulses the power on-time of the APG plasma is short enough not to cause additional charging of the reactive species, thus allowing a much more effective deposition process. So far a satisfactory explanation of this phenomenon could not be provided Pulsing the plasma with an off-time in the order of milliseconds is enough to interrupt the growth of dust particles and to limit thus the dust formation.

For minimizing the density of dust coagulation centers the use of an interval between pulses ($t_{off}$) in the order of the time of residence of the gas in the treatment space 5 of a reactor can also advantageously be used in the present invention. In this case the time between pulses should be comparable to the residence time of the gas in the discharge space. In the case of Argon/Oxygen/HMDSO for example there are reactive species with a longer lifetime which need to be flushed before the start of the next pulse. A residence time which is shorter than the cycle time (sum of pulse on-time and pulse off-time) is on the safe side, the residence time should in any case be chosen such, that there is no accumulation of dust coagulation centers. In case of the inventive embodiments using $N_2$, the residence time can be enlarged to values which are higher than the cycle time. Residence times as high as 10 times the cycle times might be used in these embodiments.

The proposed pulsed plasma method of the present invention, is based on the suppression of formation of the dust coagulation centers from the initial phase during the power on-time $t_{on}$. Furthermore, it is based on the decay of the dust coagulation centers by adjusting the power off-time $t_{off}$ and by adjusting the gas composition. The total amount of coagulation centers seem to be determined by the amount of the precursor of the chemical compound or chemical element to be deposited in the plasma gas composition, and the gas mixture used, for example the percentage of Oxygen and of course the gas flow as discussed above. In case the precursor amount in the gas mixture is reduced and/or the amount of reactive gas like Oxygen, the amount of coagulation centers in the plasma gas will also be reduced. Reducing the precursor amount in the gas composition will off course influence the efficiency of the deposition process. Best results are obtained in general with a precursor concentration from 2 to 500 ppm of the gas composition and for example an Oxygen concentration of e.g. 0.01% of the gas phase, or more, e.g. 2%, but less than 25% for example 10%.

In case of the inventive embodiments using Nitrogen, an efficient way of controlling the generation of dust coagulation centers may be accomplished by having the power supply 4 operate at a duty cycles in general from more than 1% or more than 5% for example 10% or 20% and even 50%, with short power on-times in the order of 0.05-0.5 ms. The power on-time $t_{on}$ and power off-time $t_{off}$ can be adjusted in order to maintain a large density of reactive radicals and an efficient deposition process but within the limits imposed by the above mentioned conditions.

Furthermore, it has been found that the increase of duty cycle according to various embodiments of the present invention may also be used to improve characteristics of film material. E.g. when using the present invention to deposit a $SiO_2$ film on a polyethylene naphthalate (PEN) film, the Oxygen Transmission Rate (OTR) is improved when a larger duty cycle is used. Also, when using the present invention to deposit a $SiO_2$ film on a triacetyl cellulose (TAC) film, the Water Vapor Transmission Rate (WVTR) is improved when using a larger duty cycle.

According to the present invention, ultra short pulses are applied to prevent powder or dust formation in the gas phase at atmospheric pressure in the plasma, hence substantially improving the quality of the deposit on the substrate 6.

Although Oxygen as a reactive gas in this invention has a many advantages also other reactive gases might be used like for example Hydrogen, carbon dioxide, ammonia, oxides of nitrogen, and the like.

In the present invention precursors can be can be selected from (but are not limited to): W(CO)6, Ni(CO)4, Mo(CO)6, Co2(CO)8, Rh4(CO)12, Re2(CO)10, Cr(CO)6, or Ru3(CO) 12, Tantalum Ethoxide (Ta(OC$_2$H$_5$)$_5$), Tetra Dimethyl amino Titanium (or TDMAT) SiH$_4$ CH$_4$, B$_2$H$_6$ or BCl$_3$, WF$_6$, TiCl$_4$, GeH4, Ge2H6Si2H6 (GeH3)3SiH, (GeH3)2SiH2, hexamethyldisiloxane (HMDSO), tetramethyldisiloxane (TMDSO), 1,1,3,3,5,5-hexamethyltrisiloxane, hexamethylcyclotetrasiloxane, octamethylcyclotetrasiloxane, decamethylcyclopentanesiloxane, tetraethoxysilane (TEOS), methyltrimethoxysilane, methyltriethoxysilane, dimethyldimethoxysilane, dimethyldiethoxysilane, trimethylethoxysilane, ethyltrimethoxysilane, ethyltriethoxysilane, n-propyltrimethoxysilane, n-propyltriethoxysilane, n-butyltrimethoxysilane, i-butyltrimethoxysilane, n-hexyltrimethoxysilane, phenyltrimethoxysilane, vinyltrimethoxysilane, vinyltriethoxysilane, aminomethyltrimethylsilane, dimethyldimethylaminosilane, dimethylaminotrimethylsilane, allylaminotrimethylsilane, diethylaminodimethylsilane, 1-trimethylsilylpyrrole, 1-trimethylsilylpyrrolidine, isopropylaminomethyltrimethylsilane, diethylaminotrimethylsilane, anilinotrimethylsilane, 2-piperidinoethyltrimethylsilane, 3-butylaminopropyltrimethylsilane, 3-piperidinopropyltrimethylsilane, bis(dimethylamino)methylsilane, 1-trimethylsilylimidazole, bis(ethylamino)dimethylsilane, bis(butylamino)dimethylsilane, 2-aminoethylaminomethyldimethylphenylsilane, 3-(4-methylpiperazinopropyl)trimethylsilane, dimethylphenylpiperazinomethylsilane, butyldimethyl-3-piperazinopropylsilane, dianilinodimethylsilane, bis(dimethylamino)diphenylsilane, 1,1,3,3-tetramethyldisilazane, 1,3-bis(chloromethyl)-1,1,3,3-tetramethyldisilazane, hexamethyldisilazane, 1,3-divinyl-1,1,3,3-tetramethyldisilazane, dibutyltin diacetate, aluminum isopropoxide, tris(2,4-pentadionato)aluminum, dibutyldiethoxytin, butyltin tris(2,4-pentanedionato), tetraethoxytin, methyltriethoxytin, diethyldiethoxytin, triisopropylethoxytin, ethylethoxytin, methylmethoxytin, isopropylisopropoxytin, tetrabutoxytin, diethoxytin, dimethoxytin, diisopropoxytin, dibutoxytin, dibutyryloxytin, diethyltin, tetrabutyltin, tin bis(2,4-pentanedionato), ethyltin acetoacetonato, ethoxytin (2,4-pentanedionato), dimethyltin (2,4-pentanedionato), diacetomethylacetatotin, diacetoxytin, dibutoxydiacetoxytin, diacetoxytin diacetoacetonato, tin hydride, tin dichloride, tin tetrachloride, triethoxytitanium, trimethoxytitanium, triisopropoxytitanium, tributoxytitanium, tetraethoxytitanium, tetraisopropoxytitanium, methyldimethoxytitanium, ethyltriethoxytitanium, methyltripropoxytitanium, triethyltitanium, triisopropyltitanium, tributyltitanium, tetraethyltitanium, tetraisopropyltitanium, tetrabutyltitanium, tetradimethylaminotitanium, dimethyltitanium di(2,4-pentanedionato), ethyltitanium tri(2,4-pentanedionato), titanium tris(2,4-pentanedionato), titanium tris(acetomethylacetato), triacetoxytitanium, dipropoxypropionyloxytitanium, dibutyryloxytitanium, monotitanium hydride, dititanium hydride, trichlorotitanium, tetrachlorotitanium, tetraethylsilane, tetramethylsilane, tetraisopropylsilane, tetrabutylsilane, tetraisopropoxysilane, diethylsilane di(2,4-pentanedionato), methyltriethoxysilane, ethyltriethoxysilane, silane tetrahydride, disilane hexahydride, tetrachlorosilane, methyltrichlorosilane, diethyldichlorosilane, isopropoxyaluminum, tris(2,4-pentanedionato)nickel, bis(2,4-pentanedionato) manganese, isopropoxyboron, tri-n-butoxyantimony, tri-n-butylantimony, di-n-butylbis(2,4-pentanedionato)tin, di-n-butyldiacetoxytin, di-t-butyldiacetoxytin, tetraisopropoxytin, zinc di(2,4-pentanedionate), and combinations thereof. Furthermore precursors can be used as for example described in EP-A-1351321 or EP-A-1371752.

Generally the precursors are used in a concentration of 2-500 ppm e.g. around 50 ppm of the total gas composition.

As a rough estimation the electron density is proportional with the power density (averaged over half period). According to our experimental results the product between pulse duration and the plasma power density should be smaller than 5 mJ/cm$^2$ or more preferable the absolute value of the charge density (product of current density and time) generated during the power on pulse is e.g. smaller than 5 microCoulomb/cm$^2$, for example 2 or 1 microCoulomb/cm$^2$.

The best deposition results according to this invention are obtained when using a stable controlled atmospheric glow discharge plasma. Such stabilization can be provided for example by using an electric circuit as given in FIG. 5, which comprises the power supply 4 of FIG. 1 and the associated electrodes 2, 3 of the plasma apparatus 10. The power supply 4 in this embodiment comprises a power source 15, e.g. AC power means, connected to an intermediate transformer stage 16. The frequency of said AC power supply means is selected between 10 kHz and about 30 MHz, e.g. more specific between 100 kHz and 450 kHz, e.g. 250 kHz or e.g. 130 kHz.

In this figure an impedance matching arrangement is provided in the plasma control arrangement, in order to reduce reflection of power from the electrodes 2, 3 back to the power supply (i.e. AC power supply means 15 and intermediate transformer stage 16 when present). In the embodiments described below, such an impedance matching arrangement is provided, but not further discussed for sake of clarity. The impedance matching arrangement may be implemented using a known LC parallel or series matching network, e.g. using a coil with an inductance of $L_{matching}$ and the capacity of the rest of the arrangement (i.e. formed mainly by a parallel impedance 23 (e.g. a capacitor) and/or the capacitance of the discharge space 5 between the electrodes 2, 3). The high frequency supply 15 is connected to the electrodes 2, 3 via intermediate transformer stage 16 and matching coil with inductance $L_{matching}$.

Figure 5:
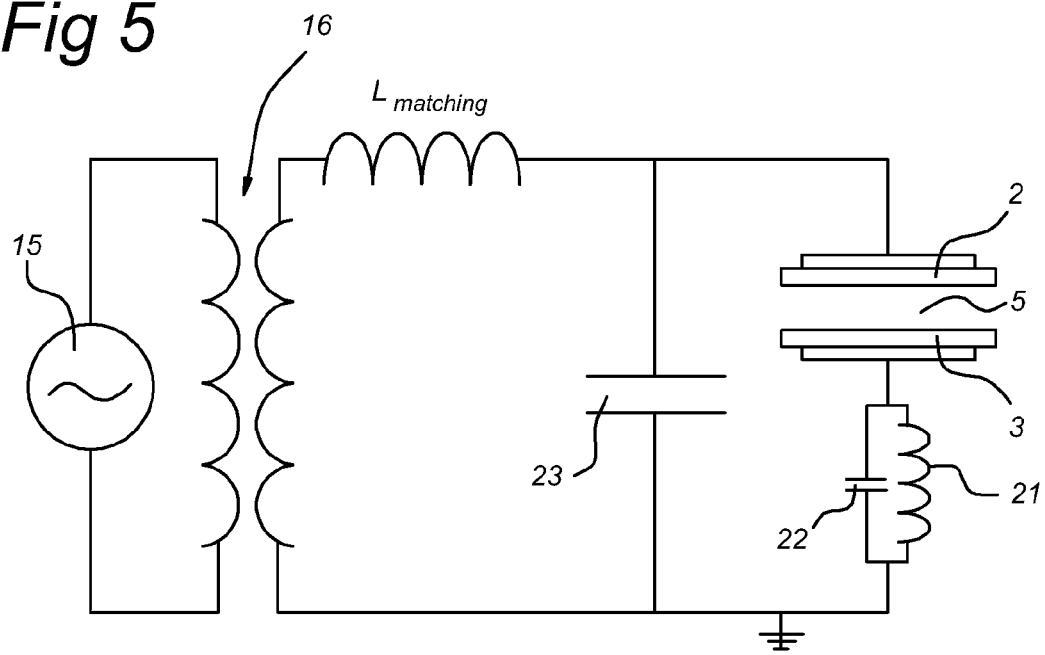
FIG. 5 shows a detailed diagram of an embodiment of an electrical circuit used for the stabilization of the plasma.

In this control arrangement for a plasma (or APG) apparatus 10, a drop of voltage on a choke 21 is generated due to the decrease of choke impedance at saturation ($L_{saturation}$) causing the short-circuit of a capacitor 22 in parallel with the choke 21. In the embodiment of FIG. 5 the choke 21 is mounted at the ground side (i.e. electrode 3). The pulse forming circuit (choke 21 and capacitor 22) can also be mounted at the high voltage (HV) side in which case choke 21 is mounted on the HV side (electrode 2). It is also possible to use a pulse forming circuit at both the ground side and the HV side. The shown parallel capacitor 23 is indicative for the sum of the capacity inserted, the capacity of the high voltage (HV) wire to electrode 2 and of the HV electrode 2 to the ground (i.e. a total value of $C_{parellel}$).

A resistor with impedance R can also be used instead of the choke 21 if it has a non-linear characteristic in which its impedance is suddenly changed from high to low. For the sake of simplicity, first this circuit will be discussed using a resistor R instead of the choke 21. In this case the voltage on the resistor will be:

$$V = V_0 * \exp\left(-\frac{t}{R_{pulse} C_{pulse}}\right)$$

where $R_{pulse}$ is the resistance of the resistor in low impedance state, $C_{pulse}$ is the capacity of the capacitor 22 in parallel with the resistor R and $V_0$ is the initial voltage before the triggering of the impedance drop. With regard to the displacement current variation this depends on the voltage variation on the APG apparatus 10 which in turn is dependent on the parasite capacity of wires and electrodes connected in series with the APG reactor (i.e. the space 5 between electrodes 2, 3). If one assumes that the pulse current is so high that it can not be provided by the power source 15, then the energy to power it must be provided by the capacitor 22 (i.e. $V_0/R_{pulse} \gg I_{generator}$), and the following applies:

$$V \approx V_{applied} * \frac{1}{1 + \frac{C_{pulse}}{C_{APG}}}$$

For an efficient pulse breakdown the voltage variation produced by the RC pulse circuit must be much larger than generated by the power source 15.

For ensuring the condition that the parasite capacity is much larger than the APG capacity a large capacity 23 is inserted in parallel with the APG electrodes 2, 3 if the RC pulse system is connected to the bottom electrode 3. In this way the capacity of the HV electrode 2 to the ground will be increased. If the RC pulse system is connected to the HV electrode 2 then the capacity of the bottom electrode 3 to the ground must be increased by mounting a larger capacity in series.

It is also important, that the value of capacitor 22 ($C_{pulse}$) is comparable with the APG capacity ($C_{APG}$). The impedance must be much larger than that of the resistor R (before the voltage drop) because otherwise the capacitor 22 can not be charged to a significant voltage.

If one would rely just on the wires parasite capacity the effect of the pulse forming circuit system may be quasi-null because then $C_{APG}/C_{parallel} \gg 1$ and $C_{pulse} \ll C_{APG}$. If the conditions for the circuit optimization are fulfilled than the displacement current drop is given by:

$$\frac{dI_d}{I_d dt} \approx \frac{-1}{R_{pulse} * C_{pulse}}$$

This equation is valid only during the time when the voltage variation of the pulse forming circuit is significant i.e. for a time period in the order of $R_{pulse}C_{pulse}$. If the $R_{pulse}$ is large but not too large ($R_{pulse} \approx 1/\omega C_{pulse}$) than the total current in the circuit will be not perturbed too much by the pulse generation and the displacement current on the APG capacitor (between electrodes 2, 3) however will drop with a rate approximately given by this equation. With the notable exception of the above case of low current pulses the RC parallel pulse system generates actually a displacement current pulse defined by a sudden increase of displacement current at the moment of impedance drop which is attenuated afterward. So the reduction of filamentation degree can be well negligible.

In a useable embodiment, not a resistor R is used as non-linear element, but a choke 21, as depicted in FIG. 5. One may simplify assuming that when the choke 21 is unsaturated, it has an inductance $L_{choke}$ and when saturated switches directly to a smaller impedance $L_{saturated}$, and the above equation for $dI_d/I_d dt$ can be rewritten as:

$$\frac{dI_d}{I_d dt} \approx \frac{-1}{\sqrt{L_{saturated} C_{pulse}}}$$

For an efficient $dI_d/I_d dt$ generation the drop of displacement current (logarithmic derivative) is in the order of at least $1/\mu s$. When a choke 21 is used instead of a resistor R than several supplementary conditions are considered. For example, the choke 21 will be saturated before plasma breakdown, but this saturation will not affect significantly the LC resonant circuit powering the system formed by $L_{matching}$ and the rest of capacities present in the APG apparatus 10. The perturbation of the resonant circuit is due to the fact that when the choke 21 is saturated, the capacitor 22 ($C_{pulse}$) is in short circuit and the capacity of the APG apparatus 10 increases. For avoiding perturbation of the resonant circuit the following requirement is set:

$$\frac{C_{APG}}{C_{parallel}\left(1 + \frac{C_{APG}}{C_{pulse}}\right)} \ll 1$$

So again, a capacitor 23 with a larger capacity $C_{parallel}$ is mounted in parallel with the series circuit of APG electrodes 2, 3 and pulse forming circuit in this embodiment.

For saturating the choke 21, the current through the choke 21 calculated when the amplitude of the applied voltage is equal to the breakdown voltage of the plasma pulse, is at least equal to the saturation current. However the choke 21 can not saturate well before the plasma breakdown or otherwise the pulse generated by the choke saturation will end before the plasma breakdown. So the condition is that the choke 21 will be still be saturated when the voltage on the APG plasma is equal to the breakdown voltage $U_{br}$.

$$I_{choke}^{max} = \frac{U_{br}\omega C_{APG}}{|\omega^2 L_{choke} C_{pulse} - 1|}$$

$$I_{sat} = 0.6 - 0.7 * I_{choke}^{max}$$

Where $I^{max}_{choke}$ is the maximum possible current through the choke 21 (if the choke 21 would not saturate), i.e calculated taking in account the unsaturated impedance of the choke $L_{choke}$. $I^{max}_{choke}$ has a resonance when $\omega^2 * L_{choke} * C_{pulse}=1$. This allows that the choke 21 will be saturated with low voltage (and power applied to APG) so it allows operation for plasmas with lower breakdown voltages. However the voltage drop on the pulse system also has a resonance when $\omega^2 * L_{choke} * C_{pulse}=1$ so a larger total voltage should be applied to the system.

Expressed as a function of the voltage of the power source 15 the resonance of the choke current shifts to $\omega^2 L_{choke}(C_{APG}+C_{pulse})=1$. Note that only if $\omega^2 L_{choke} C_{pulse} > 1$ it is likely that a large impedance drop of the choke 21 will be generated as a result of the choke saturation. When the choke 21 will start to saturate the impedance decreases but in order to enhance the saturation the current on the choke 21 must increase. If this condition is satisfied as a result of the saturation the choke 21 will generate a high voltage current pulse having a frequency band around the resonant frequency of the pulse forming circuit $$\omega_{choke} = \frac{1}{\sqrt{L_{saturated}C_{pulse}}}$$

The mechanism of the displacement current drop is described below. During the plasma breakdown a displacement current drop and a voltage drop may be obtained due to the excitation of resonance's as a result of the change in current frequencies band as a result of the plasma breakdown. This is due to an impedance resonance. The impedance has a minimum at $\omega^2 * L_{choke} * (C_{pulse} + C_{APG}) = 1$. When plasma is ON the APG capacity of the plasma is short circuited by the plasma and then the only remaining capacity in series with the pulse forming circuit 20 is mainly of the ionic sheath which is comparable with the APG capacity. The dielectric capacity is negligible in comparison with those of the sheath. So the new resonance is obtained for frequencies ores at which: $\omega^2 * L_{saturated} * (C_{pulse} + C^p{}_{APG}) = 1$ where $C^p{}_{APG}$ is the equivalent capacity of the APG with plasma ON. If the frequency band of the choke 21 is coincident with the plasma characteristic frequencies the current to the plasma will be boosted and the APG capacity and parallel capacity 23 will discharge and a drop of voltage and of displacement current will be generated.

The mechanism of voltage and displacement current drop consists of following steps:

when the plasma is OFF due to the change of impedance the current resonance frequencies is changed to a value comparable with the plasma characteristic frequencies.

if APG equivalent capacity is comparable with $C_{pulse}$ the voltage increase pulse generated by the saturated choke 21 has also frequencies in the band of the current resonance and a plasma current resonance is triggered.

the voltage on the APG plasma decreases due to the large currents.

The above conditions are allowing only a limited range of values for $\omega^2 * L_{choke} * C_{pulse} = 1$ because they are linked to resonances.

To conclude the important design criteria are:

pulse system capacity comparable with that of APG capacity;

$C_{parallel} > C_{APG}$;

$L_{saturated} < L_{choke}$ (which is a condition for selection of the ferrite core of the choke 21);

$L_{saturated} * C_{pulse} < 10^{-12} s^2$;

$\omega^2{}_{plasma} L_{saturated} (C_{APG} + C_{pulse}) = 1$;

$\omega^2 L_{choke} C_{pulse} > 2-3$ for achieving choke saturation and a large inductance decrease, or in the case of the ultra-strong saturation resonance when choke impedance is mainly a resistor: $\omega^2 L_{choke} C_{pulse} = 1$.

In an alternative embodiment of the present invention (shown in FIG. 6) in parallel with the pulse capacitor 22a series resonant LC circuit is mounted, comprising the choke 21 and a further capacitor 24 with a capacity of $C_{res}$. It will be clear that the choke 21 of this embodiment may have different characteristics from the choke 21 used in the FIG. 5 embodiment. The capacity $C_{res}$ of further capacitor 24 is set in such a way that the circuit will be resonant at the operating frequency of the APG apparatus 10.

$$C_{res} = \frac{1}{\omega^2 L}$$

Firstly, in this case the choke 21 is prevented to be saturated by the discharge of capacitor 22 ($C_{pulse}$). This will happen only when the frequency becomes equal to:

$$\omega^2_{res} = \frac{1}{L_{choke}(C_{pulse} + C_{res})}$$

Until the plasma breakdown, the current flowing through the circuit is consisting mainly of the resonant frequency RF component and the resonant circuit is resistive with a resistance $R_{rlc}$. After the plasma breakdown large current components of RF frequency are generated and the choke 21 becomes saturated (i.e. has a lower impedance) and the impedance of the resonant circuit increases. At low plasma currents when the choke 21 can not saturate, the plasma having larger frequencies does not pass through the resonant circuit but through the larger impedance $C_{pulse}$ of capacitor 22. Thus the choke-capacitor circuit becomes quasi-capacitive and the voltage on the bottom electrode 3 has a fast jump of at least $$\Delta V = \frac{I_{plasma}}{\omega C_{pulse}} - I_d * R_{rlc}$$

If the effect of the choke saturation is taken in to account the jump can be larger i.e $$\Delta V = \frac{I_{plasma}}{\omega C_{pulse}} + \frac{I_d}{\omega C_{res}} - I_d * R_{rlc}$$

For maximization of the voltage jump in this embodiment, the following condition is dictated:

$$1/\omega(C_{pulse} + C_{res}) \ll R_{rlc}$$

Also, the choke 21 must barely saturate around the plasma breakdown in order to be pushed to a stronger saturation by plasma current, and thus:

$$I_{sat} = 0.8 \, U_{br} \omega C.$$

One can see in the above conditions that the voltage jump is dependent on the plasma current so the feedback is dependent on the plasma current (so a feedback at low current is minimal). A solution may be to arrange the inductance saturation currents in such a way that at the plasma breakdown the choke 21 will be more saturated without any contribution from the plasma. In this case a jump of voltage can be generated due to the choke saturation.

The choke and capacitor parallel arrangement of the embodiment illustrated in FIG. 5 has the advantage of the longer pulses but also slower drops of displacement current. The choke and capacitor in series arrangement of the embodiment illustrated in FIG. 6 has the advantage of a good synchronization with plasma and of sharper drops of displacement current (which is optimum for the breakdown). Nevertheless the duration is limited to the breakdown and/or cut-off region. A simultaneous mounting of both embodiment (e.g. one of them connected to the HV electrode 2 and the other one at the bottom electrode 3) may provide even better results.

Also two parallel arrangements on either side of the APG electrodes 2, 3 or two series arrangements on either side of the APG electrodes 2, 3 or even a parallel arrangement on one side and a series arrangement on the other side give a further stability improvement.

Figure 6:
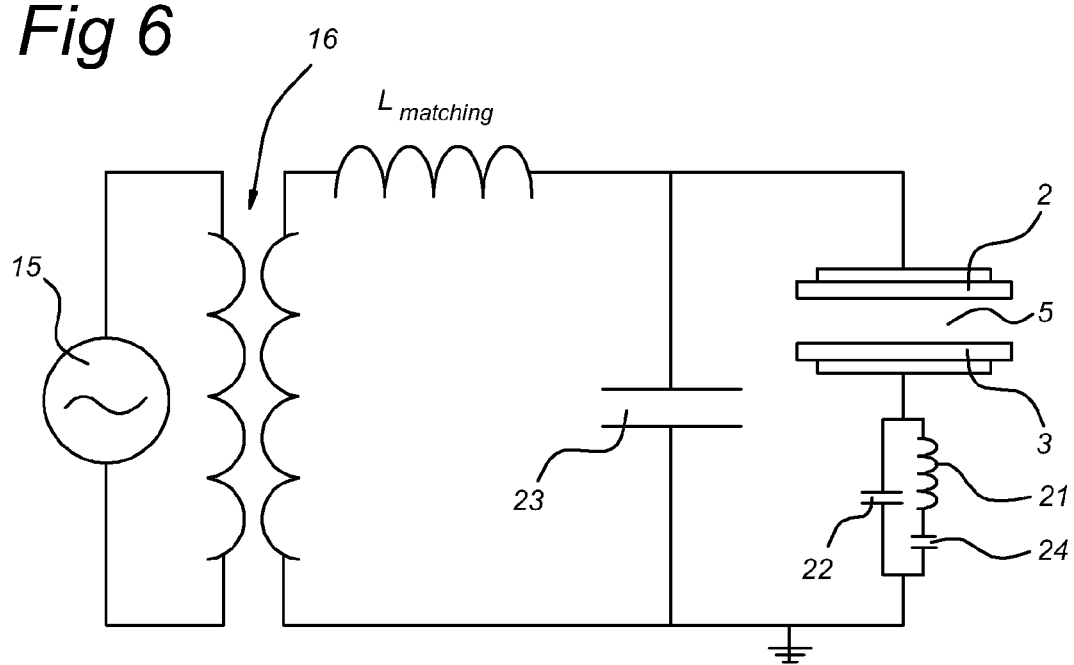
FIG. 6 shows another detailed diagram of an embodiment of an electrical circuit used for the stabilization of the plasma.

An even further embodiment has the same structure as the embodiment of FIG. 6, but in this case the pulse forming circuit is not necessarily to be resonant, but must have an overall inductive impedance. The capacitor $C_{res}$ 24 is used in this embodiment to shift the moment of saturation of choke 21 closer to the plasma breakdown.

Using the circuits of FIG. 5 and FIG. 6 for the plasma generating apparatus results in a controlled and stable plasma, without streamers, filamentary discharges or other imperfections.

Until now the dust free deposition of chemical compounds using atmospheric pressure glow discharge plasma's could not be achieved, because of the absence of power supplies which were capable of providing very short pulses. According to the present invention power supply 4 of FIG. 1 is used having the possibility to generate ultra short pulse trains from 20 µs up to 500 ms. It has been found that dust forming may be prevented when the on-time $t_{on}$ is shorter than the time necessary for forming charged particles in the treatment space, e.g. less than 0.5 ms, or even less than 0.3 ms. Using this power supply, voltage pulse trains may in fact be formed of a series of sine waves having a total duration time (pulse on-time) of 20-500 microseconds. In total the pulse train contains typically 10 to 30 periods of such sine waves. The duty cycle of the power supply 4 (the ratio between the on-time $t_{on}$ and the sum of the on-time $t_{on}$ and off-time $t_{off}$) may vary from 1 to 50%, e.g. between 10 and 20%.

In one embodiment the apparatus according to the present invention, including the stabilized circuit of FIG. 5 or FIG. 6, short pulses and the presence of Nitrogen in the gas composition, can provide for deposition rates of more than 1 nm/s e.g. 5 nm/s or even 10 nm/s.

It another embodiment the apparatus of this invention including the stabilized circuit of either FIG. 5 or FIG. 6, the short pulses and the presence of Nitrogen in the gas composition is used to apply multiple layers of material by having multiple passes of the substrate through the treatment space, or by having treatment spaces placed in line with each other. In this last embodiment layers of different composition can be applied over each other in a very efficient way, having a thickness of each layer of 1 nm or more.

The substrates used in this invention in general have a thickness from 20 µm to 800 µm, for example 50 µm or 200 µm and can be selected from: SiO2 wafers, glasses ceramics, plastics and the like. By this inventive method and apparatus layers of a chemical compound or chemical element can be deposited on substrates having a relatively low Tg, meaning that also common plastics, like polyethylene, polypropylene, Triacetylcellulose, PEN, PET, polycarbonate and the like can be provided with a deposition layer The substrates provided with the deposition according to the present invention can be used in a wide range of application like wafer manufacturing, they can be used as barrier plastics or application where a conductive layer on an isolator is required and the like.

Figure 8:
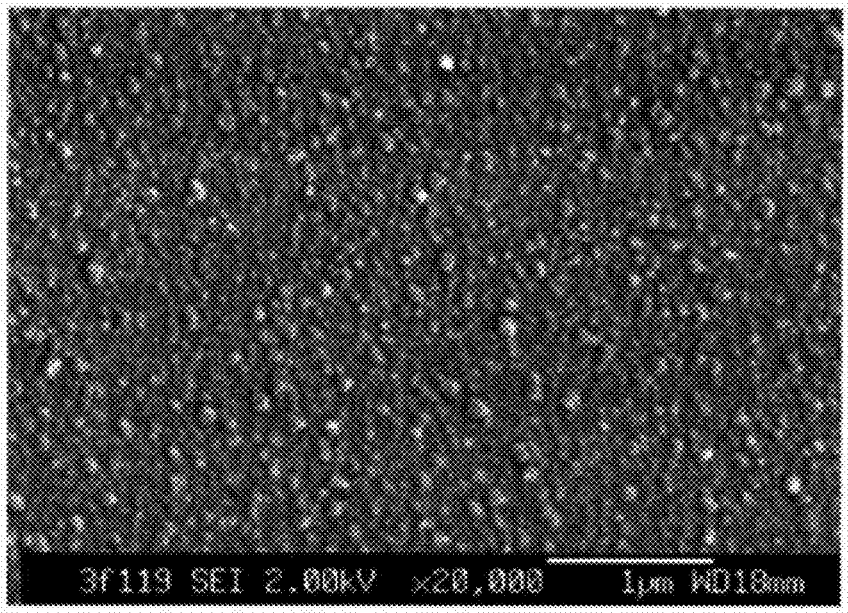
FIG. 8 shows an electron microscope picture of a surface deposit obtained using a prior art method.

A first exemplary reference test was performed using an excitation frequency of 130 kHz and a 200 microseconds pulse on-time with a 10% duty cycle. Typical dimension of the electrode are a gap distance of 1 mm and a "working length" (width) of 4 cm. The gas flow yields a typical gas flow speed of about 1 m/s. The gas composition in the treatment space 5 comprised a mixture of Argon, 5% $O_2$, and HMDSO (300 mg/hr). The result was a layer deposition with clear dust formation on the surface 6, as examined in a 20,000 magnification image of the surface 6 (FIG. 8). Longer pulse on-times showed even much stronger powder formation.

Figure 7:
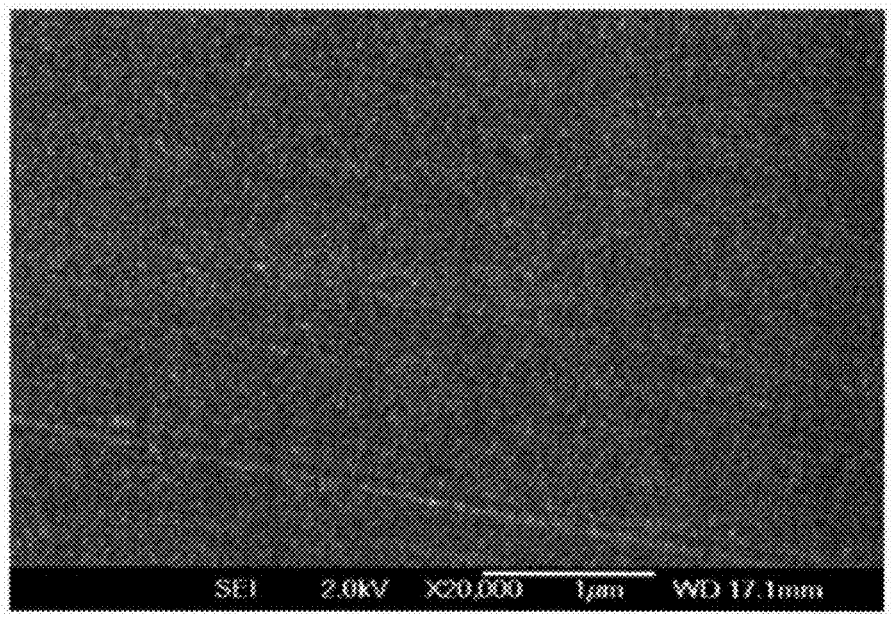
FIG. 7 shows an electron microscope pictures of a surface deposited with an apparatus and method according to this invention.

A second exemplary test according to an embodiment of the present invention was performed using an excitation frequency of 130 kHz and pulse on-time of 0.2 ms with a 10% duty cycle. The electrode gap and gas flow was kept the same as in the first exemplary reference test. The gas composition in the treatment space 5 comprised a mixture of Argon and Nitrogen in a 4 to 1 ratio (i.e. about 76% Ar, 19% $N_2$), 5% $O_2$, and HMDSO (300 mg/hr). The result this time was a very uniform layer deposition on the surface 6, again examined in a 20,000 magnification image (FIG. 7). Note that in this case part of the sample had to be provided with dust particles in order to be able to focus with the electron microscope on the surface 6.

In order to generate such short pulses, an external oscillator was build using a standard PC equipped with a National Instruments interface card PCI-MIO-16E-4. The desired pulse trains are programmed and send as an analog signal to the amplifier (in this case type RFPP-LF 10a).

Further experimentation was carried out to study the possible further benefits of using Nitrogen in addition to amounts of Oxygen in the gas composition in an APG discharge plasma. The further possible benefits relate to improving the Oxygen Transmission Rate (OTR) of Polyethylene Naphthalate (PEN) film, or to improving the Water Vapor Transmission Rate (WVTR) in Tri Acetyl Cellulose (TAC) film.

Figure 9:
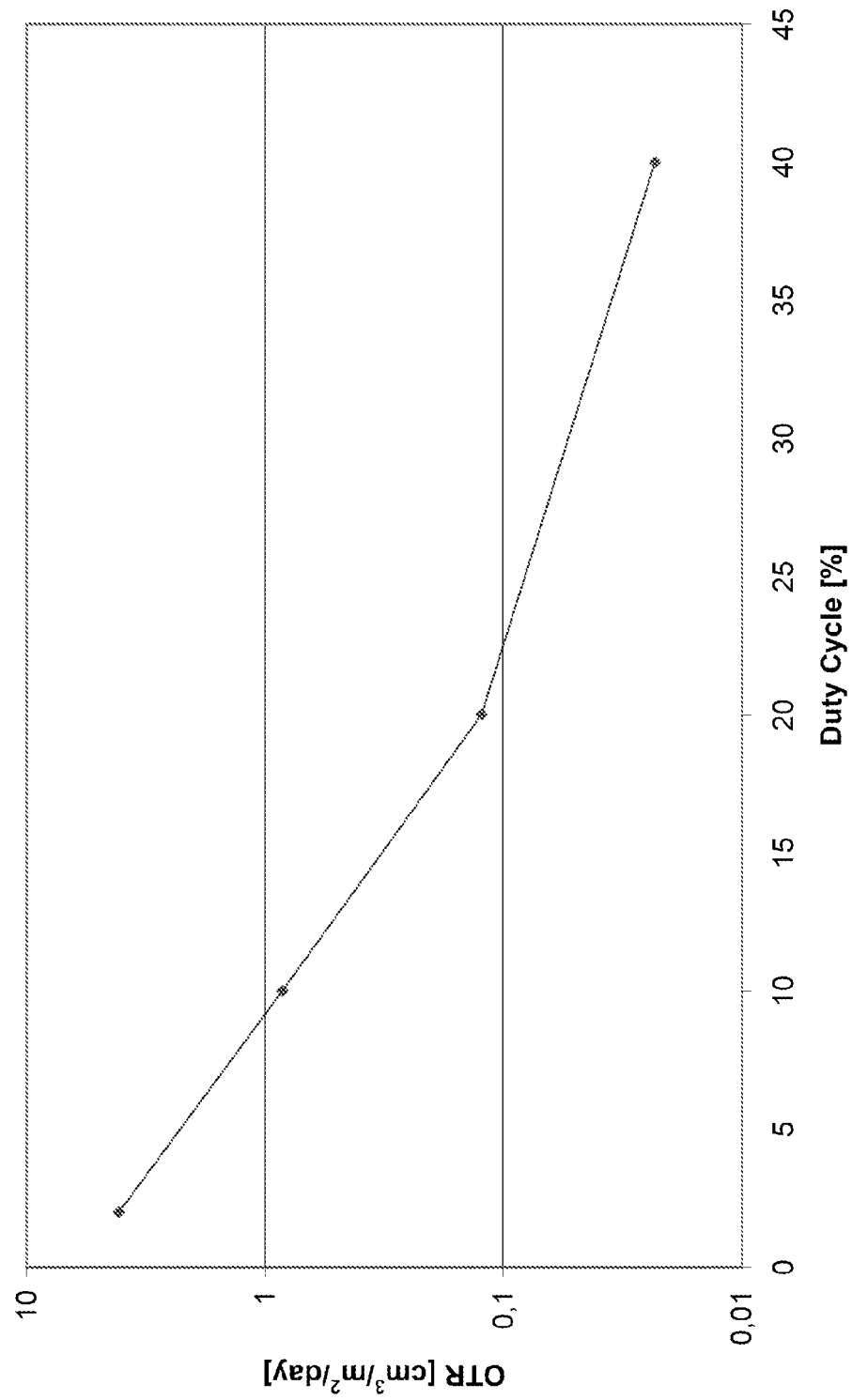
FIG. 9 shows a diagram of the obtained Oxygen Transmission Rate of a PEN film treated by an embodiment of the present invention, as a function of duty cycle.

In a first experiment, Advanced Photo System (APS) PEN film was treated using an atmospheric pressure glow discharge plasma to obtain a deposition film. The gasses used in this experiment were Argon at 10 slm (about 82.7%), nitrogen at 2 slm (about 16.5%), oxygen at 0.1 slm (about 0.8%), and HMDSO at 300 mg/hr. The pulse parameters of the plasma generation apparatus, operating at a frequency of 130 kHz using a series resonant network and a pulsing network as described above for other embodiments, were a pulse time of 200 µs and a varying duty cycle. The results of the experiments which were performed at 2% duty cycle, 10% duty cycle and 20% duty cycle are shown in FIG. 9, which shows the OTR of the treated APS-PEN film as a function of the duty cycle of the plasma treatment (OTR was measured using a Mocon Oxtran 2/21 measuring device). The $SiO_2$ layer deposited using the present method was typically 60 nm. As described in the other experiments above, the deposition of the layer was very uniform, due to the lack of dust formation. For a duty cycle of 20%, a barrier improvement factor ($OTR_{substrate}/OTR_{subtrate+coating}$) of 40 was observed. A further experiment using a duty cycle of 40% resulted in a measured OTR of 0.03 $cm^3/m^2$/day, which indicates that the trend shown in FIG. 9 may be extrapolated for higher duty cycles. Even better results were obtained when the Oxygen content was as low as 0.4%.

A further series of experiments was conducted for depositing $SiO_2$ on a TAC film. An important parameter for such a TAC film is the WVTR. Experiments with varying duty cycle were carried out, using the following gas composition: Argon at 10 slm, nitrogen at 2 slm, oxygen at 0.1 slm, and HMDSO at 300 mg/hr. The operating frequency was again set at 130 kHz, and the pulse length was 200 µs. The following table shows the results:

|  | Duty Cycle [%] | WVTR [$g/m^2$/day] |
| --- | --- | --- |
| TAC | — | 105 |
| TAC + $SiO_2$ | 10 | 25 |
| TAC + $SiO_2$ | 20 | 5 |

Again, a trend is observed that the WVTR for TAC film may be improved by increasing the duty cycle of the plasma treatment apparatus.

The invention claimed is:

1. A method for deposition of a chemical compound or element on a substrate using an atmospheric pressure glow discharge plasma in a treatment space, the method comprising:

applying electrical power from an AC power supply to at least two electrodes in the treatment space to generate the atmospheric pressure glow discharge plasma, wherein the treatment space is filled with a gas composition comprising (i) a precursor of the chemical compound or element to be deposited; (ii) between 1 and 99.99% $N_2$; and (iii) between 0.01 and 25% $O_2$, and wherein the AC power supply generates pulse trains during an on-time ($t_{on}$) of the AC power supply, each pulse train comprising at least 10 periods of sine waves.

2. The method according to claim 1, wherein the precursor is used in a concentration from 2 to 500 ppm.

3. The method according to claim 2, wherein the gas composition comprises 75% to 99.99% a mixture of noble gas and $N_2$ and from 0.01 to 25% $O_2$, wherein the amount of $N_2$ and noble gas in the mixture each is between 1 to 99%, and the total gas composition sums up to 100%, including the precursor amount.

4. The method according to claim 1, wherein the gas composition further comprises an active gas, wherein the active gas partly or completely replaces the amount of $O_2$ in the gas composition.

5. The method of claim 4, wherein the active gas is selected from the group consisting of hydrogen gas, carbon dioxide, ammonia, and oxides of nitrogen.

6. The method according to claim 1, wherein the on-time ($t_{on}$) is from 0.02 ms to 500 ms.

7. The method according to claim 1, wherein the on-time ($t_{on}$) is shorter than a time predetermined necessary for forming charged particles in the treatment space.

8. The method according to claim 7, wherein the predetermined time period is less than 0.5 ms.

9. The method according to claim 8, wherein the predetermined time period is less than 0.3 ms.

10. The method according to claim 7, where the ratio between the on-time ($t_{on}$) and the sum of the on-time ($t_{on}$) and the off-time ($t_{off}$) is at least 1%.

11. The method according to claim 1, where the atmospheric glow discharge plasma is stabilized by stabilization means counteracting local instabilities in the plasma.

12. The method according to claim 11, wherein the local instabilities in the plasma are counteracted by applying an AC plasma energizing voltage to the electrodes causing a plasma current and a displacement current, wherein the discharge plasma is controlled by applying a displacement current change (dI/Idt) for controlling local current density variations associated with a plasma variety having a low ratio of dynamic to static resistance.

13. The method according to claim 12, wherein the displacement current change is provided by applying a change in the applied voltage (dV/Vdt) to the two electrodes, the change in applied voltage being about equal to an operating frequency of the AC plasma energizing voltage, and the displacement current change (dI/Idt) having a value at least five times higher than the change in applied voltage (dV/Vdt).

* * * * *